(12) United States Patent
Coleman

(10) Patent No.: US 7,512,422 B2
(45) Date of Patent: Mar. 31, 2009

(54) RF GENERATOR WITH COMMUTATION INDUCTOR

(75) Inventor: Charles Coleman, Fort Collins, CO (US)

(73) Assignee: IXYS Corporation, Milpitas, CA (US)

( * ) Notice: Subject to any disclaimer, the term of this patent is extended or adjusted under 35 U.S.C. 154(b) by 525 days.

(21) Appl. No.: 11/140,609

(22) Filed: May 26, 2005

(65) Prior Publication Data

US 2005/0275980 A1    Dec. 15, 2005

Related U.S. Application Data

(60) Provisional application No. 60/575,435, filed on May 28, 2004.

(51) Int. Cl.
*H04B 1/04* (2006.01)
*H04M 1/00* (2006.01)
*H02J 3/00* (2006.01)
*H02M 3/00* (2006.01)

(52) U.S. Cl. ............... 455/572; 455/571; 455/127.1; 363/15; 363/17; 363/21.03; 363/34

(58) Field of Classification Search ............. 455/571, 455/572, 127.1, 343.1; 363/15–17, 21.03, 363/34–38
See application file for complete search history.

(56) References Cited

U.S. PATENT DOCUMENTS

| | | | |
|---|---|---|---|
| 3,568,021 A * | 3/1971 | Turnbull | 318/808 |
| 4,884,168 A | 11/1989 | August et al. | |
| 5,088,005 A | 2/1992 | Ciaccio et al. | |
| 5,218,322 A | 6/1993 | Allison et al. | |
| 5,245,520 A * | 9/1993 | Imbertson | 363/17 |
| 5,287,919 A | 2/1994 | George et al. | |
| 5,424,614 A | 6/1995 | Maheshwari | |
| 5,546,294 A * | 8/1996 | Schutten et al. | 363/17 |
| 5,559,467 A | 9/1996 | Smedley | |
| 5,781,419 A * | 7/1998 | Kutkut et al. | 363/17 |
| 5,903,583 A | 5/1999 | Ullman et al. | |
| 6,034,489 A | 3/2000 | Weng | |
| 6,046,641 A | 4/2000 | Chawla et al. | |
| 6,064,584 A | 5/2000 | Cornec et al. | |

(Continued)

FOREIGN PATENT DOCUMENTS

DE    19514544 A1    10/1996

(Continued)

OTHER PUBLICATIONS

Coleman, C., U.S. Appl. No. 11/140,493 for "RF Generator With Voltage Regulator," filed May 26, 2005.

(Continued)

*Primary Examiner*—Duc M Nguyen
(74) *Attorney, Agent, or Firm*—Townsend and Townsend and Crew LLP

(57) ABSTRACT

A radio frequency (RF) generator comprises a first half bridge including first and second power transistors; a second half bridge including first and second power transistors; an RF output node coupling output nodes of the first and second half bridges, the output node outputting RF signals to a load; positive and negative rails coupled to a power source; and a first commutation inductor provided to store energy to commutate at least one of the half bridges.

18 Claims, 8 Drawing Sheets

U.S. PATENT DOCUMENTS

| | | | |
|---|---|---|---|
| 6,072,362 A | 6/2000 | Lincoln et al. | |
| 6,094,350 A | 7/2000 | Achirioaie | |
| 6,133,788 A | 10/2000 | Dent et al. | |
| 6,137,233 A | 10/2000 | Moisin | |
| 6,246,599 B1 | 6/2001 | Jang et al. | |
| 6,380,694 B1 | 4/2002 | Uchihashi et al. | |
| 6,388,317 B1 | 5/2002 | Reese | |
| 6,469,919 B1 | 10/2002 | Bennett | |
| 6,862,195 B2 * | 3/2005 | Jitaru | 363/17 |
| 6,937,483 B2 * | 8/2005 | Zhu et al. | 363/17 |
| 7,102,431 B2 | 9/2006 | Bier | |
| 7,259,622 B2 * | 8/2007 | Coleman | 330/251 |
| 7,259,623 B2 * | 8/2007 | Coleman | 330/251 |
| 2001/0004312 A1 | 6/2001 | Miyajima et al. | |
| 2002/0097085 A1 | 7/2002 | Stapleton | |
| 2004/0145584 A1 | 7/2004 | Lee et al. | |
| 2004/0228153 A1 | 11/2004 | Cao et al. | |

FOREIGN PATENT DOCUMENTS

| | | |
|---|---|---|
| EP | 508717 A | 10/1992 |
| GB | 2240425 A * | 7/1991 |
| JP | 09-102568 A1 | 5/1997 |
| WO | WO 98/37627 A1 | 8/1998 |
| WO | WO 01/95688 A1 | 12/2001 |

OTHER PUBLICATIONS

Coleman, C., U.S. Appl. No. 11/140,404 for "RF Generator With Reduced Size and Weight," filed May 27, 2005.

Coleman, C., U.S. Appl. No. 11/139,273 for "RF Generator With Phase Controlled MOSFETS," filed May 27, 2005.

* cited by examiner

RF GENERATOR WITH COMMUTATION INDUCTOR

BACKGROUND OF THE INVENTION

The present applications claims the benefit of U.S. Provisional Patent Application Ser. No. 60/575,435, filed on May 28, 2004, which is incorporated by reference.

BACKGROUND OF THE INVENTION

The present invention relates to an radio frequency (RF) generator with a full bridge configuration.

A power amplifier or generator is a circuit for converting DC-input power into a significant amount of RF/microwave output power. There is a great variety of different power amplifiers (PAs). A transmitter contains one or more PAs, as well as ancillary circuits such as signal generators, frequency converters, modulators, signal processors, linearizers, and power supplies. As used herein, the terms "power generator," "RF generator," and "power amplifier" are used interchangeably.

Frequencies from very low frequency (VLF) through millimeter wave (MMW) are used for communication, navigation, and broadcasting. Output powers vary from 10 mW in short-range unlicensed wireless systems to 1 MW in long-range broadcast transmitters. PAs and transmitters are also used in systems such as radar, RF heating, plasma generation, laser drivers, magnetic-resonance imaging, and miniature DC/DC converters.

RF power amplifiers are commonly designated into various different classes, i.e., classes A-F. Classes of operation differ in the method of operation, efficiency, and power-output capability. The power-output capability (or transistor utilization factor) is defined as output power per transistor normalized for peak drain voltage and current of 1 V and 1 A, respectively.

FIG. 1 illustrates a basic single-ended power amplifier 100. The power amplifier includes an active device 102, DC feed 104, and output filter/matching network 106. FIGS. 2A-2F illustrate drain voltage and current waveforms of selected ideal power amplifiers. FIG. 2A illustrates a wave form for a class A device. FIG. 2B illustrates a wave form for a class B device, and so on.

Generally, RF power amplifiers utilize a wide variety of active devices, including bipolar-junction transistors (BJTs), MOSFETs, JFETs (SITs), GaAs MESFETs, HEMTs, pHEMTs, and vacuum tubes. The power-output capabilities range from tens of kilowatts for vacuum tubes to hundreds of watts for Si MOSFETs at HF and VHF to hundreds of milliwatts for InP HEMTs at MMW frequencies. Depending upon frequency and power, devices are available in packaged, chip, and MMIC form. RF-power transistors generally are n-p-n or n-channel types because the greater mobility of electrons (versus holes) results in better operation at higher frequencies.

While the voltages and currents differ considerably, the basic principles for power amplification are common to all devices. In class-A amplification, the transistor is in the active region at all times and acts as a current source controlled by the gate drive and bias. The drain-voltage and drain-current waveforms are sinusoids, as shown in FIG. 2A. This results in linear amplification. The DC-power input is constant, and the instantaneous efficiency is proportional to the power output and reaches 50% at PEP. For amplification of amplitude-modulated signals, the quiescent current can be varied in proportion to the instantaneous signal envelope. The utilization factor is ⅛. Class A offers high linearity, high gain, and operation close to the maximum operating frequency of the transistor.

FIG. 2B illustrates drain voltage and current waveforms of a class B device. The gate bias in this device is set at the threshold of conduction. The transistor is active half of the time, and the drain current is a half-sinusoid. Since the amplitude of the drain current is proportional to drive amplitude, class B provides linear amplification. For low-level signals, class B is significantly more efficient than class A, and its average efficiency can be several times that of class A at high peak-to-average ratios (e.g., 28% versus 5% for $\xi=10$ dB). The utilization factor is the same as in class A, i.e., ⅛. Class B is widely used in broad-band transformer-coupled PAs operating at HF and VHF.

FIG. 2C illustrates drain voltage and current waveforms of a class C device. The gate of a conventional class-C device is biased below threshold, so that the transistor is active for less than half of the RF cycle. Linearity is lost, but efficiency can be increased arbitrarily toward 100% by decreasing the conduction angle toward zero. This causes the output power (utilization factor) to decrease toward zero and the drive power to increase toward infinity. A typical compromise is a conduction angle of 150° and an ideal efficiency of 85%. When it is driven into saturation, efficiency is stabilized, and the output voltage is locked to supply voltage.

FIG. 2D illustrates drain voltage and current waveforms of a class D device. Class-D devices use two or more transistors as switches to generate square drain-voltage (or current) waveforms. A series-tuned output filter passes only the fundamental-frequency component to the load, resulting in a power outputs of $(8/\pi^2)V^2_{DD}/R$ for the transformer-coupled configuration. Current is drawn generally only through the transistor that is on, resulting in a 100% efficiency for an ideal power amplifier. The utilization factor ($1/2\pi=0.159$) is the highest of the different classes of power amplifiers. If the switching is sufficiently fast, efficiency is not degraded by reactance in the load.

Generally, class-D devices suffer from losses due to saturation, switching speed, and drain capacitance. Finite switching speed causes the transistors to be in their active regions while conducting current. Drain capacitances are charged and discharged generally once per RF cycle, resulting in power loss that is proportional and increases directly with frequency. Class-D devices with power outputs of 100 W to 1 kW are readily implemented at HF.

FIG. 2E illustrates drain voltage and current waveforms of a class E device. Class E employs a single transistor operated as a switch. The drain-voltage waveform is the result of the sum of the DC and RF currents charging the drain-shunt capacitance. In optimum class E, the drain voltage drops to zero and has zero slope just as the transistor turns on. The result is an ideal efficiency of 100%, elimination of the losses associated with charging the drain capacitance in class D, reduction of switching losses, and good tolerance of component variation. Optimum class-E operation requires a drain shunt susceptance of 0.1836/R and a drain series reactance 1.15 R. It delivers a power output of $0.577V^2_{DD}/R$ for an ideal power amplifier with a utilization factor of 0.098. Variations in load impedance and shunt susceptance cause the power amplifier to deviate from optimum operation, but the degradations in performance are generally no worse than those for classes A and B.

FIG. 2F illustrates drain voltage and current waveforms of a class F device. Class F boosts both efficiency and output by using harmonic resonators in the output network to shape the drain waveforms. The voltage waveform includes one or more odd harmonics and approximates a square wave, while the current includes even harmonics and approximates a half sine wave. Alternately ("inverse class F"), the voltage can approximate a half sine wave and the current a square wave. As the number of harmonics increases, the efficiency of an ideal power amplifier increases from the 50% (class A) toward unity (e.g., 0.707, 0.8165, 0.8656, 0.9045 for two, three, four, and five harmonics, respectively) and the utilization factor increases from $\frac{1}{8}$ toward $\frac{1}{2\pi}$. The required harmonics arise naturally from nonlinearities and saturation in the transistor. While class F requires a more complex output filter than other power amplifiers, the impedances at the "virtual drain" generally need to be correct at only a few specific frequencies.

Recently, high voltage MOSFETs, e.g., with 500V or 1000V MOSFETs, have been used in class "C" or "E" operation. However, the class C and E devices are narrow band approaches because the square wave drive pulses require a filter to remove unwanted spectral content. Efficiency is high but power control is difficult. Power control is usually a variable DC power supply which results in slow control of the output power and difficulty in controlling power at low levels. It is possible to drive these classes with a sine wave; however, the turn-on threshold varies with the MOSFET die temperature which will change the conduction angle (pulse width) of the MOSFET, which can be problematic.

SUMMARY OF THE INVENTION

The present invention relates to an RF generator that has a full bridge configuration. The full bridge configuration comprises high voltage MOSFETs that are operated using phase shift techniques. The MOSFETs are configured to handle 300 volts or more, or 500 volts or more, or 600 volts or more, or 1000 volts or more according to applications. The RF generator is configured to operate in a range of 5 MHz to 50 MHz. In the present embodiment, the RF generator is configured to operate at an Industrial Scientific and Medical (ISM) frequency, e.g., 13.56 MHz or 27.12 MHz. In one implementation, the RF generator is a class D device and is configured to operate directly off line.

Generators with phase shift control have been used in recent years at frequencies below 500 KHz. These power supply designs are at much lower frequencies than the present invention, which is in radio frequencies. Generally, it is difficult to increase the operating frequency of bridges. Gate drive becomes very difficult for larger MOSFETs as the operating frequency is raised. The drive current can exceed 10 Ampere peaks for turn-on and turn-off. Unwanted resonances can occur due to the large gate capacitance and very small stray inductances. These unwanted resonances can result in uncontrolled turn-on or off of the MOSFETs and result in failure of devices. At lower frequencies, hard switching at high voltages is not a limiting factor. At high frequency, e.g., 13.56 MHz, hard switching at high voltage is a serious concern as power dissipation becomes excessive. Zero voltage switching becomes a preferred design. This operation is difficult to maintain over the full operating range of a power stage when phase is shifted.

The present embodiments use one or more commutation inductors to store sufficient energy to provide the energy needed to charge the output capacitance of the MOSFETs and provide RF generators with phase shift control. There are various advantages associated such RF generators: (1) may be operated in a broader frequency range, (2) may operate with fixed DC voltages that are not highly filtered, (3) eliminates the need for a variable DC power supply, and (4) may be operated at very low power to full power.

In one embodiment, a radio frequency (RF) generator comprises a first half bridge including first and second power transistors; a second half bridge including first and second power transistors; an output node coupling the first and second half bridges and RF signals to a load; positive and negative rails coupled to an AC power source via a rectifier; a first blocking capacitor provided between the positive rail and the load; and a second blocking capacitor provided between the negative rail and the load. The first and second blocking capacitors are configured to isolate the load from the AC power source.

In another embodiment, a radio frequency (RF) generator comprises a first half bridge including first and second power transistors; a second half bridge including first and second power transistors; an RF output node coupling output nodes of the first and second half bridges, the output node outputting RF signals to a load; positive and negative rails coupled to an AC power source via a rectifier; and a first commutation inductor provided to store energy and facilitate commutation of at least one of the half bridges.

The first commutation inductor is provided between the first and second half bridges, so that there is no potential difference across the first commutation inductor when the first and second half bridges are in phase.

The RF generator further comprises a capacitor provided between the first commutation inductor and the output node of the second half bridge. The RF generator further comprises a second commutation inductor provided proximate the first half bridge to commutate the first half bridge.

The RF generator further comprises a first commutation circuit including a second commutation inductor, the first commutation circuit being provided proximate the first half bridge to commutate the first half bridge. The RF generator further comprises a second commutation circuit provide proximate the second half bridge to commutate the second half bridge.

In another embodiment, a radio frequency (RF) generator includes a first half bridge including first and second power transistors; a second half bridge including first and second power transistors; an RF output node coupling output nodes of the first and second half bridges, the output node outputting RF signals to a load; positive and negative rails coupled to an AC power source via a rectifier; and a first commutation inductor configured to store energy and facilitate commutation of at least one of the half bridges, wherein the RF signals are output to the load using phase displacements of the transistors.

In yet another embodiment, a method for operating an RF generator having first and second half bridges comprising a full bridge configuration, includes causing the first half bridge to output a first signal with a first phase; causing the second half bridge to output a second signal with a second phase; combining the first and second signals to provide an RF signal to a load coupled to the RF generator; and storing energy in a commutation inductor to store energy to facilitate commutation of at least one of the first and second half bridges.

DETAILED DESCRIPTION OF THE INVENTION

The present invention relates to an RF generator that has a full bridge configuration. The full bridge configuration comprises high voltage MOSFETs that are operated using phase shift techniques.

The present embodiment relates to an RF generator operating at an ISM frequency, e.g., 13.56 MHz, as disclosed in U.S. patent application Ser. No. 11,140,404, entitled, "RF Generator With Reduced Size and Weight," filed on May 27, 2005, assigned to the assignee of the present application, which is incorporated by reference. The RF generator uses a high voltage phase shift controlled full bridge. A full bridge design offers several advantages which are helpful in RF operation. These include a higher utilization of the MOSFET ratings. In a bridge design, the voltage is limited to the supply rail (e.g., positive rail), whereas it is not the case in a class C or E, and thus must be designed with very large margins in case of reflected power. Another advantage is the drive pulse width is fixed. Phase shift control allows the output power to be controlled by the phase displacement between two half bridges. The two outputs are summed to produce a single output which can be varied from zero to full output power by controlling the phase difference between the two half bridges. This allows power control with fixed supply voltage rails which because of the high operation frequency can be operated directly off line by using blocking capacitors.

One advantage of using a phase shift design is the ability to vary frequency. The high Q circuits used with classes C and E preclude varying frequency by any significant amount. The bridge circuit has a symmetry which results in an ability to adjust and thus reduce second harmonic distortion. This allows for a different output network design which can provide for a wider frequency of operation because it does not require as much attenuation of the second harmonic.

In class C and E devices, the output power is typically control by using a variable DC power supply. This limits the speed at which the output power can be varied to that of the DC power supply. The phase shift control limits the speed at which power can be varied only to the speed at which phase can be varied and the Q of the output network. Phase can be varied at rates of 10 degrees per cycle or more and thus can result in very high speed power control or pulsing.

Another characteristic of the phase shift is improved performance at low power. Conventional designs using class C or E have great difficulty when the power supply voltage is reduced to low levels. This is due to the large capacitances, at low drain voltages, in the MOSFET, allowing gate drive signals to be fed to the output through the Crss capacitance (drain to gate capacitance) and detuning of the output network with the very large increase in the average output capacitance Coss. There are other advantages associated with the present RF generator, as will be appreciated by those skilled in the art.

Figure 1:
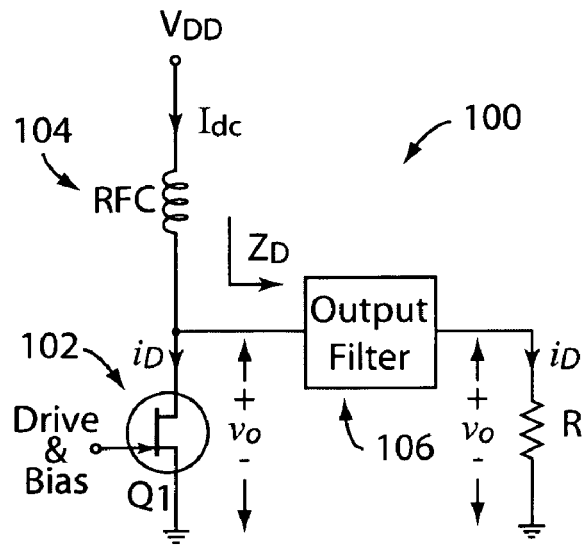
FIG. 1 illustrates a basic single-ended power amplifier 100.
Figure 2A:
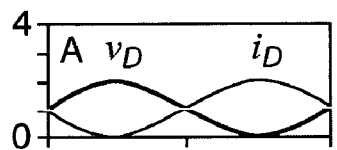
FIG. 2A illustrates drain voltage and current waveforms of class A device.
Figure 2D:
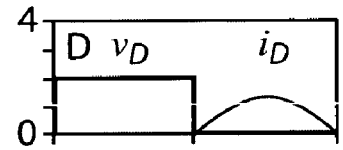
FIG. 2D illustrates drain voltage and current waveforms of a class D device.
Figure 2B:
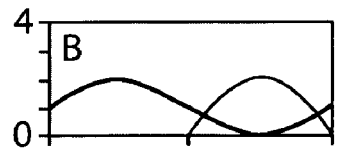
FIG. 2B illustrates drain voltage and current waveforms of a class B device.
Figure 2E:
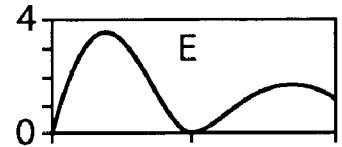
FIG. 2E illustrates drain voltage and current waveforms of a class E device.
Figure 2C:
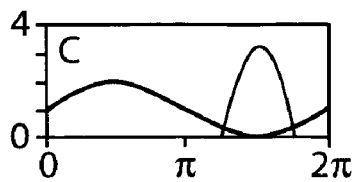
FIG. 2C illustrates drain voltage and current waveforms of a class C device.
Figure 2F:
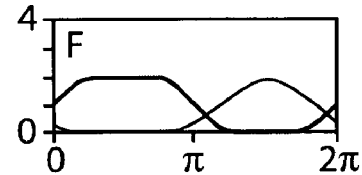
FIG. 2F illustrates drain voltage and current waveforms of a class F device.
Figure 3:
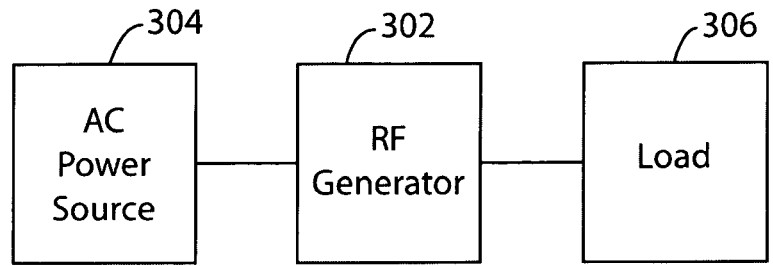
FIG. 3 illustrates an RF generator being coupled to an AC power source and a load.

FIG. 3 illustrates an RF generator 302 being coupled to an AC power source 304 and a load 306. The power source is a typical AC source with a relatively low frequency, e.g., 60 Hz. The load is a device or equipment, e.g., a plasma chamber, that is run using the output generated by the RF generator.

Figure 4:
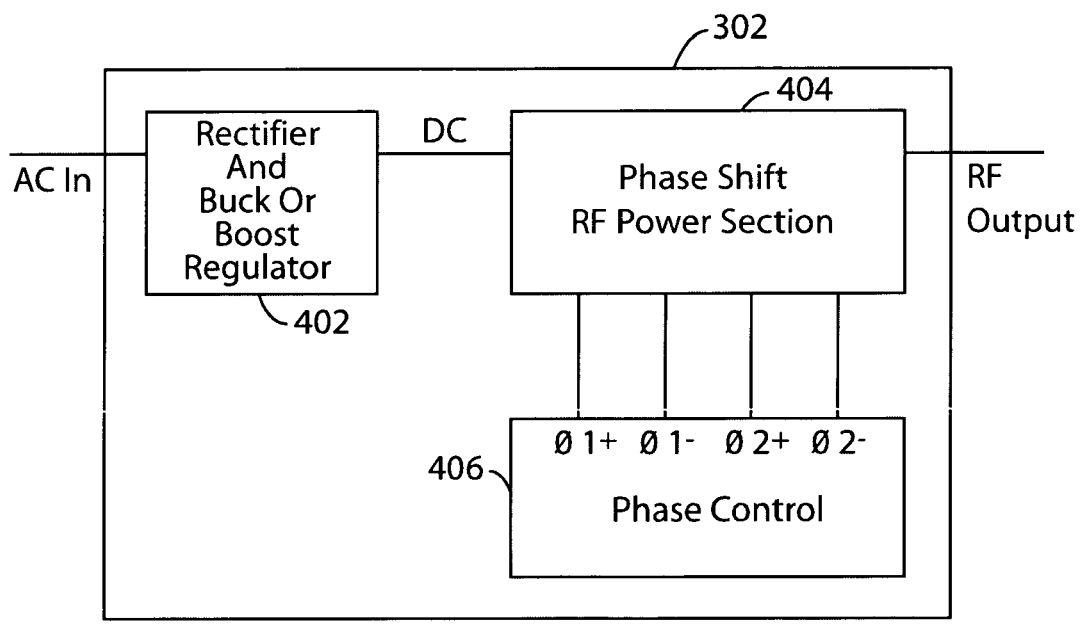
FIG. 4 illustrates a more detailed view of the RF generator according to one embodiment of the present invention.

FIG. 4 illustrates a more detailed view of the RF generator 302 according to one embodiment of the present invention. The RF generator includes a rectifier 402 that receives the AC current and converts it into a DC current. The RF generator uses fixed DC voltages rather than variable DC power supply since phase shift technique is used. Generally, the rectifier includes a bridge configuration to convert the 60 Hz to a DC current. A phase shift RF power section 404 receives the DC current and sends out an RF output according to the controls of a phase control 406. The phase control comprises four gate drivers, each driving a MOSFET (see FIG. 5) that is arranged in a full-bridge configuration.

Figure 5:
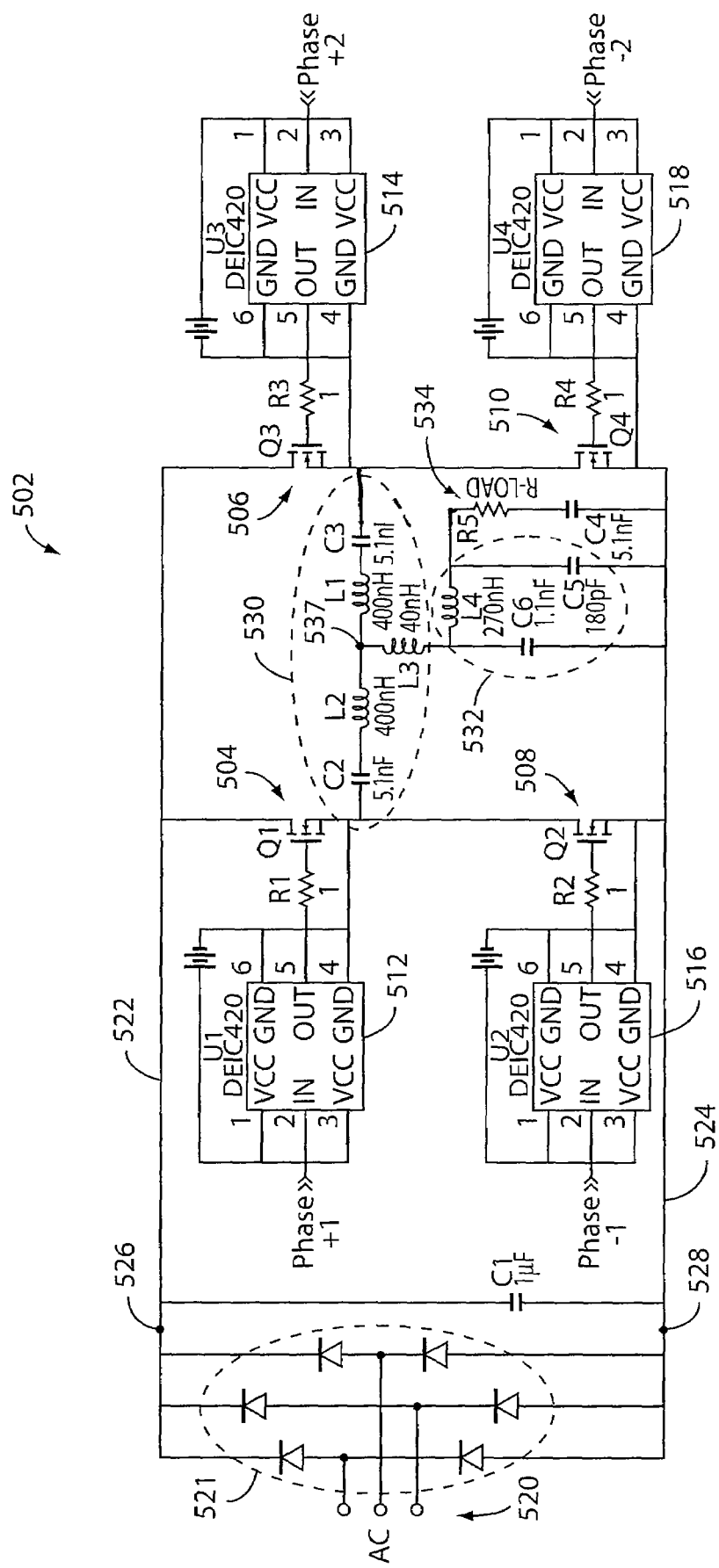
FIG. 5 illustrates an RF generator having a full bridge configuration according to one embodiment of the present invention.

FIG. 5 illustrates an RF generator 502 having a full bridge configuration according to one embodiment of the present invention. The RF generator 502 includes first, second, third and fourth MOSFETs 504, 506, 508, and 510. In the present implementation, the MOSFETs are "IXYS-RF MOSFET IXZ211N50," but other types of power MOSFETs may be used in other implementations. The first and third MOSFETs 504 and 508 define a first half bridge, and the second and fourth MOSFETs 506 and 510 define a second half bridge.

First, second, third, and fourth gate drivers 512, 514, 516, and 518 are coupled to the control terminals of the first, second, third, and fourth MOSFETs, respectively. The MOSFETs are configured to handle at least 500 volts and at least 11 amperes in the present implementation. An AC power source 520 is coupled to a positive rail 522 and a negative rail 524 via a rectifier 521, defining a given potential difference V. The rectifier is provided between the AC power source and nodes 526 and 528 to provide DC currents to the node 526. The DC currents are supplied to the first and second MOSFETs via the positive rail 522. A first capacitor C1 is provided between the positive and negative rails. IN the present embodiment, a fixed DC voltage is provided to the first and second MOSFETs.

A resonant circuit 530 is provided between the output nodes of the first and second MOSFETs, so that the RF generator can operate at resonate frequency and avoid hard switching. The circuit 530 includes second and third capacitors C2 and C3, and first, second, and third inductors L1, L2, and L3.

In the present implementation, the second and third capacitors have capacitance of 5.1 nf each. The first and second inductors L1 and L2 have inductance of 400 nH each. The third inductor L3 has inductance of 40 nH. In other implementations, these components may have different values.

The values of the inductors L1 and L2 have been selected to facilitate the commutation of the MOSFETs, such that hard switching is avoided for much of the phase shift range. Hard switching is not completely avoided in the present embodiment because the currents in the inductors are not identical as phase shift is varied. One of the half bridges would have a reduced current as the phase is changed from zero of 180 degrees. The reduction in current results in only a partial resonant commutation with the remainder being hard switching.

An impedance matching circuit 532 is provided between the resonate circuit 530 and a load 534 that is represented as a resistor R5. The matching circuit includes a fourth inductor L4 and fifth and sixth capacitors C5 and C6.

In the present implementation, the fourth inductor has inductance of 270 nH. The fifth and sixth capacitors C5 and C6 have capacitance of 180 pf and 1.1 nf, respectively. These components may have different values in different implementations.

The RF generator 502 also includes a plurality of blocking capacitors C2, C3, and C4 to isolate the load 534 from the power section and operate the RF generator directly off line. The blocking capacitor or fourth capacitor C4 has capacitance of 5.1 nf in the present implementation but may have other values in other implementations.

Figure 6:
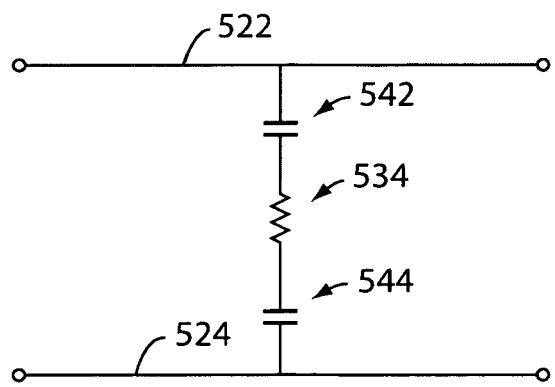
FIG. 6 illustrates a schematic circuit showing locations of one or more blocking capacitors.

To operate directly offline, at least two blocking capacitors are used. That is, at least one blocking capacitor 542 is provided between the positive rail 522 and the load 534, as shown in FIG. 6. The capacitor 542 corresponds to the blocking capacitor C2 or C3. At least another blocking capacitor 544 is provided between the negative rail 544 and the load 534. The capacitor 544 corresponds to the blocking capacitor C4. The great difference in frequency between the very high output frequency (e.g., 13.56 MHz) and the very low input frequency (e.g., 60 Hz) of the AC power source 520 enables the use of low frequency blocking capacitors C2, C3, and C4 to isolate the load from the power section. This allows the output to be grounded without excessive current flow from the 60 Hz power In operation, the phase of the two half bridges of the RF generator 502 is varied to control the power output. The output of the two half bridges are combined using a network to sum the outputs into a single node 537. The single node is then impedance matched to the output using the matching circuit 532.

Figure 7A:
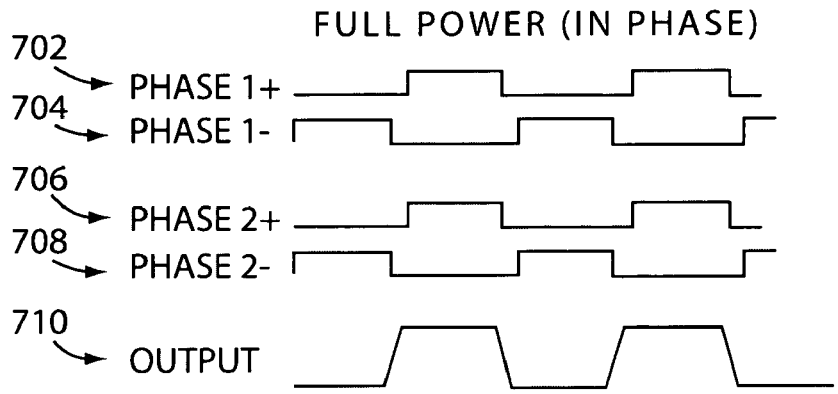
FIG. 7A illustrates the waveforms when the half bridges are controlled to output full power.
Figure 7B:
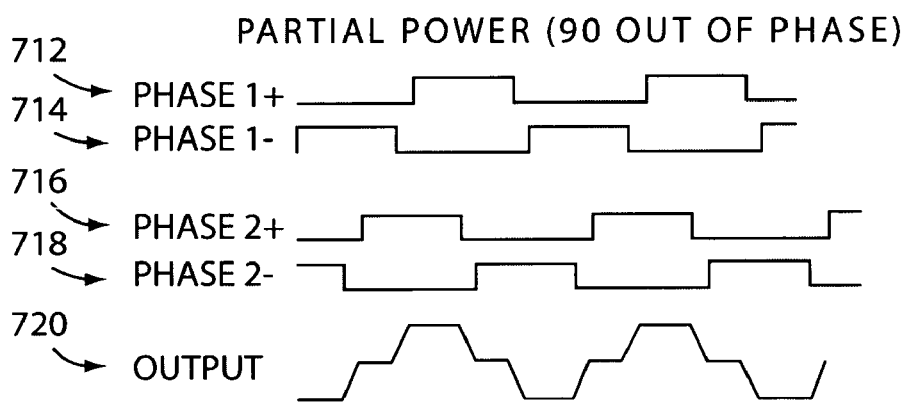
FIG. 7B illustrates the waveforms when the MOSFETs are operated at about 90 degrees out of phase.
Figure 7C:
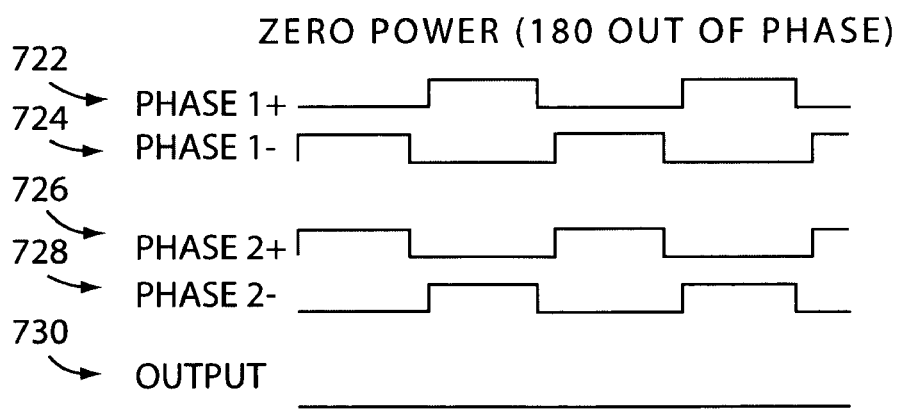
FIG. 7C illustrates the waveforms when the MOSFETs are operated at 180 degrees out of phase.

FIGS. 7A-7C illustrate the waveforms generated by the RF generator 502 according to the present embodiment. These waveforms are illustrated as quasi-square waves for illustrative convenience. However, they are in reality closer to sine waves due to the filtering of the total network.

FIG. 7A illustrates the waveforms when the half bridges are controlled to output full power. A zero degree phase relationship is maintained for this operation. A first waveform 702 illustrates the output of the MOSFET 504, and a second waveform 704 illustrates the output of the MOSFET 508. Similarly, a third waveform 706 illustrates the output of the MOSFET 506, and a fourth waveform 708 illustrates the output of the MOSFET 510. An output waveform 710 illustrates the power output of the RF generator that results from combining the outputs of the above MOSFETs. Since the MOSFETs are operated in phase, full power is output. The node 537 switches at full pulse widths similar to the drive waveforms.

FIG. 7B illustrates the waveforms when the MOSFETs are operated at about 90 degrees out of phase. A first waveform 712 illustrates the output of the MOSFET 504, and a second waveform 714 illustrates the output of the MOSFET 508. Similarly, a third waveform 716 illustrates the output of the MOSFET 506, and a fourth waveform 718 illustrates the output of the MOSFET 510. An output waveform 720 illustrates the output of the RF generator that results from combining the outputs of the above MOSFETs. The power output is lower since the MOSFETs are not being operated in phase, as shown by the smaller pulses.

FIG. 7C illustrates the waveforms when the MOSFETs are operated at 180 degrees out of phase. A first waveform 722 illustrates the output of the MOSFET 504, and a second waveform 724 illustrates the output of the MOSFET 508. Similarly, a third waveform 726 illustrates the output of the MOSFET 506, and a fourth waveform 728 illustrates the output of the MOSFET 510. An output waveform 730 illustrates the output of the RF generator that results from combining the outputs of the above MOSFETs. Since the MOSFETs operated 180 degrees out of phase, no power is output.

Although there is no power output when the MOSFETs are operated in 180 degrees out of phase, currents continue to flow through the inductors L1 and L2. These inductors are being charged and discharged. The potential of the node 537, however, does not change and remains at the same level. This is so since the inductors L1 and L2 are a voltage divider, each with the same inductance. The node 537 remains at V/2 (i.e., a half of the potential difference between the positive and negative rails 522 an 524) as long as the drive is symmetrical.

Figure 8A:
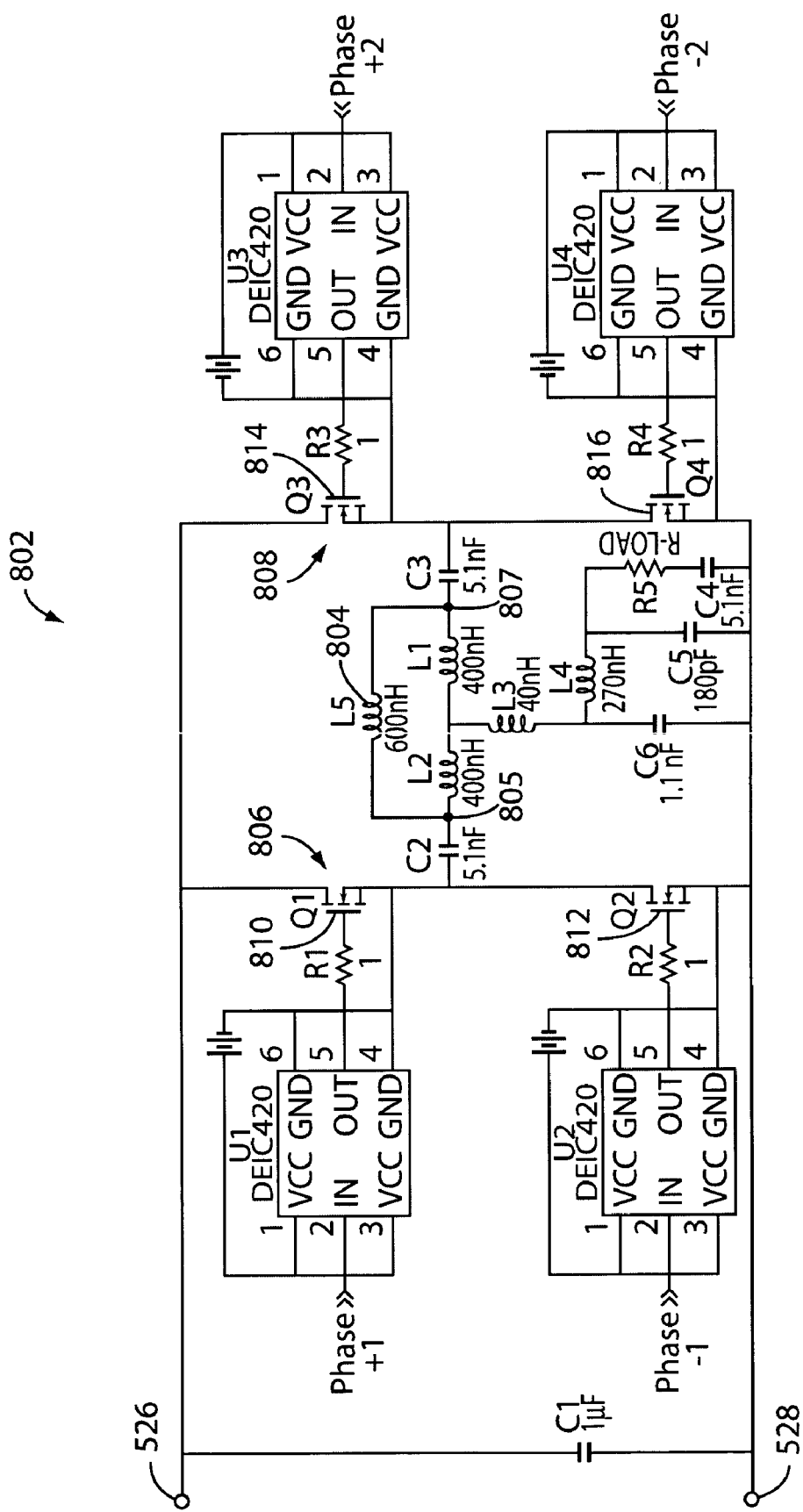
FIG. 8A illustrates an RF generator with a commutation inductor according to one embodiment of the present invention.

FIG. 8A illustrates an RF generator 802 with a commutation inductor 804 (or inductor L5) according to one embodiment of the present invention. The RF generator 802 has a full bridge configuration as with the RF generator 502, discussed above. Nodes 526 and 528 couple a DC source, as before, so the same numerals are used for illustrative convenience.

The communication inductor 804 is provided between the two half bridges 806 and 808. The half bridge 806 includes an upper MOSFET 810 and a lower MOSFET 812. The half bridge 808 includes an upper MOSFET 814 and a lower MOSFET 816.

The commutation inductor 804 has one end connected to a node 805 that is provided between a capacitor C2 and an inductor L2. Another end of the commutation inductor is connected to a node 807 that is provided between a capacitor C3 and an inductor L1. The inductor 804 has inductance of 600 nH in the present embodiment. The communication inductor may have other values in other implementations.

In phase controlled RF bridges, the current drops in one of the two bridges as phase is changed. At RF frequencies (2 MHz and up), MOSFET commutation in a bridge circuit is of great concern. Hard switching results in very high power dissipation and low efficiency. One commonly-used method to prevent this is to resonant the output in a high Q network. This method, however, restricts the operation to a narrow frequency and load range.

To avoid hard switching, a typical RF approach is to add a conjugate to cancel the output capacitance. This approach, however, may not be suitable as the average capacitance varies greatly as the power supply rails are changed.

In the present embodiment, the commutation inductor/circuit 804 is added to limit hard switching. The commutation inductor 804 stores energy for commutating the half bridge. This inductor is provided across the phase controlled bridges and has the benefit of only being present, as far as the circuit is concerned, when less than full output is selected (i.e., the two half bridges are not in phase). At full output, there is no potential difference across the inductor so no current flows in the inductor. When the two half bridges are not in phase, current will flow through the inductor and help maintain commutation current with the energy stored in the inductor.

Figure 8B:
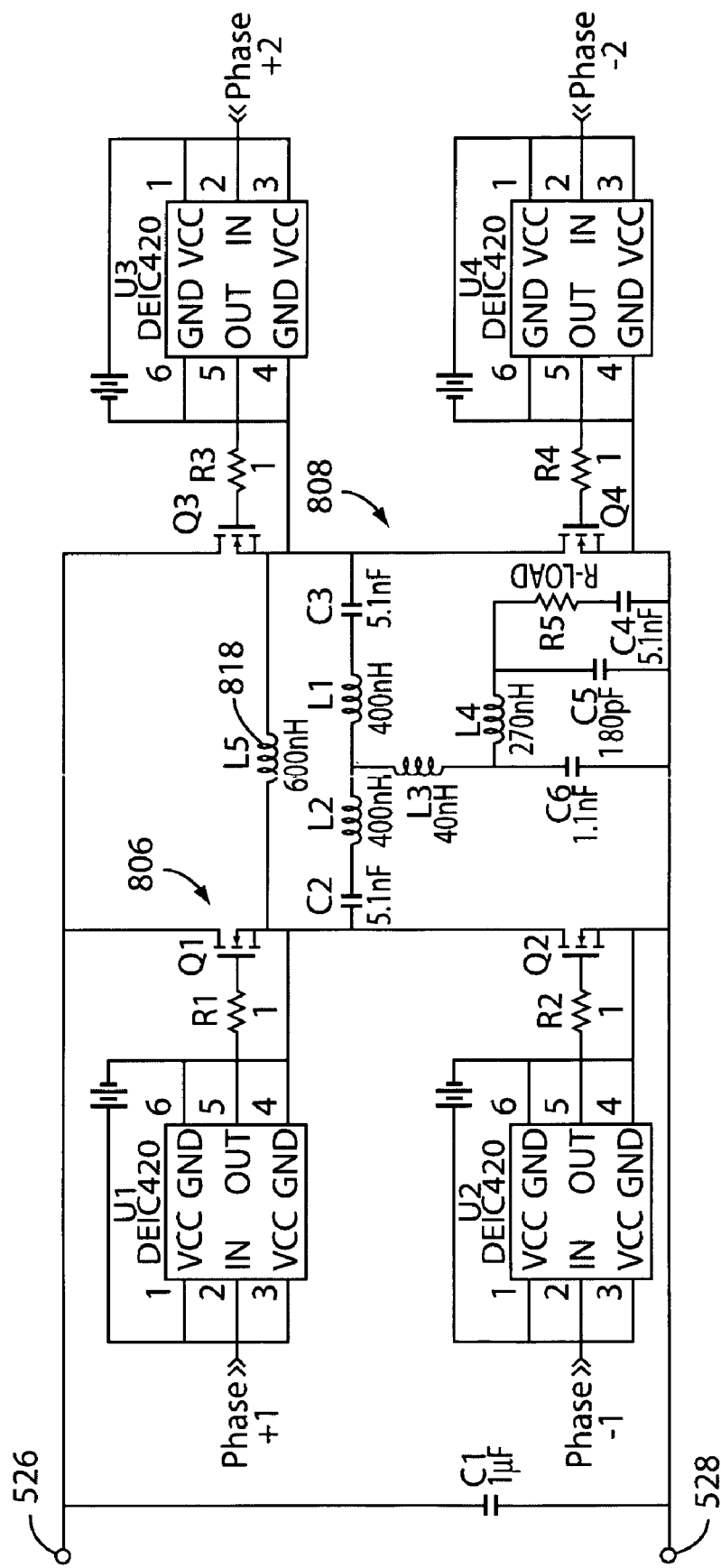
FIG. 8B illustrates a commutation inductor that is provided between the two half bridges and directly connected to their outputs.

The commutation inductor may be arranged differently according to implementations. For example, FIG. 8B illustrates a commutation inductor 818 that is provided between the two half bridges and directly connected to their outputs. A capacitor (not shown) may be provided between the communication inductor 818 and the output of one of the half bridges, e.g., the half bridge 808.

Figure 8C:
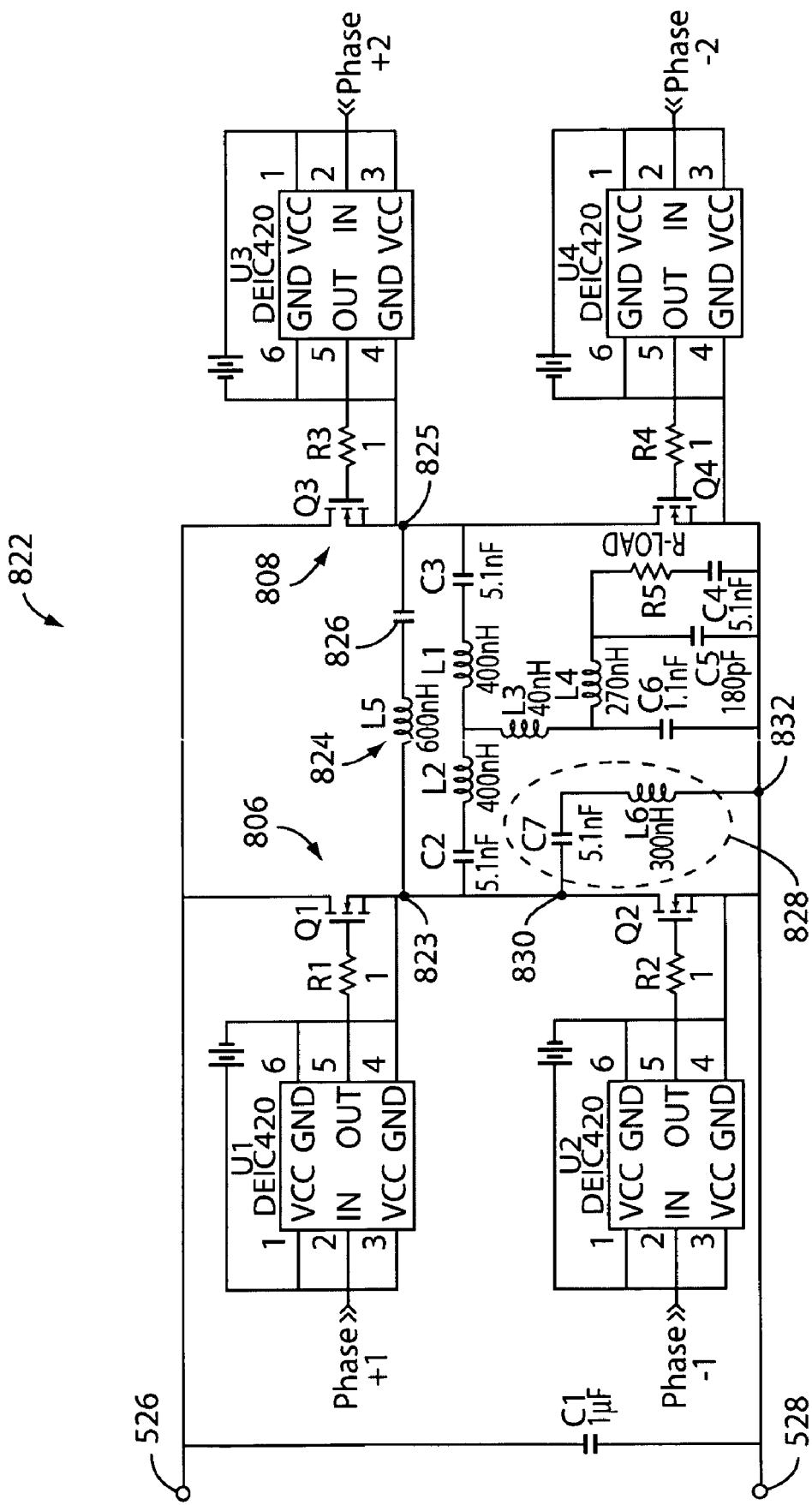
FIG. 8C illustrates an RF generator with a commutation inductor according to one embodiment of the present invention.

FIG. 8C illustrates an RF generator 822 with a commutation inductor 824 according to one embodiment of the present invention. The RF generator 802 has a full bridge configuration as with the RF generator 502, discussed above. Nodes 526 and 528 couple a DC source, as before, so the same numerals are used for illustrative convenience.

The communication inductor 824 is provided between the two half bridges 806 and 808. The commutation inductor 824 has one end coupled to a node 823 and another end coupled to a node 825. The node 823 is connected to an output of the half bridge 806, and the node 825 is connected to an output of the half bridge 808. A capacitor 826 is provided between the inductor 824 and the node 825 as a DC blocking capacitor.

The RF generator 822 includes a communication circuit 828 that is connected to a node 830 and a node 832. The commutation circuit includes a capacitor C7 and an inductor L6 in series. The capacitor C7 is proximate the node 830, and the inductor L6 is proximate the node 832. Alternatively, the capacitor C7 is proximate the node 832, and the inductor L6 is proximate the node 830. The node 830 is connected to the output of the half bridge 806. The node 832 is connected to the output of the half bridge 832.

The commutation circuit 828 is used to store energy to facilitate the commutation of the half bridge 806. Unlike the commutation inductor 824, the commutation circuit 828 is always present and is an additional load even at full power (zero phase condition). The series capacitor-inductor (or circuit 828) can be used on bridges which are not phase controlled to improve commutation.

Figure 9:
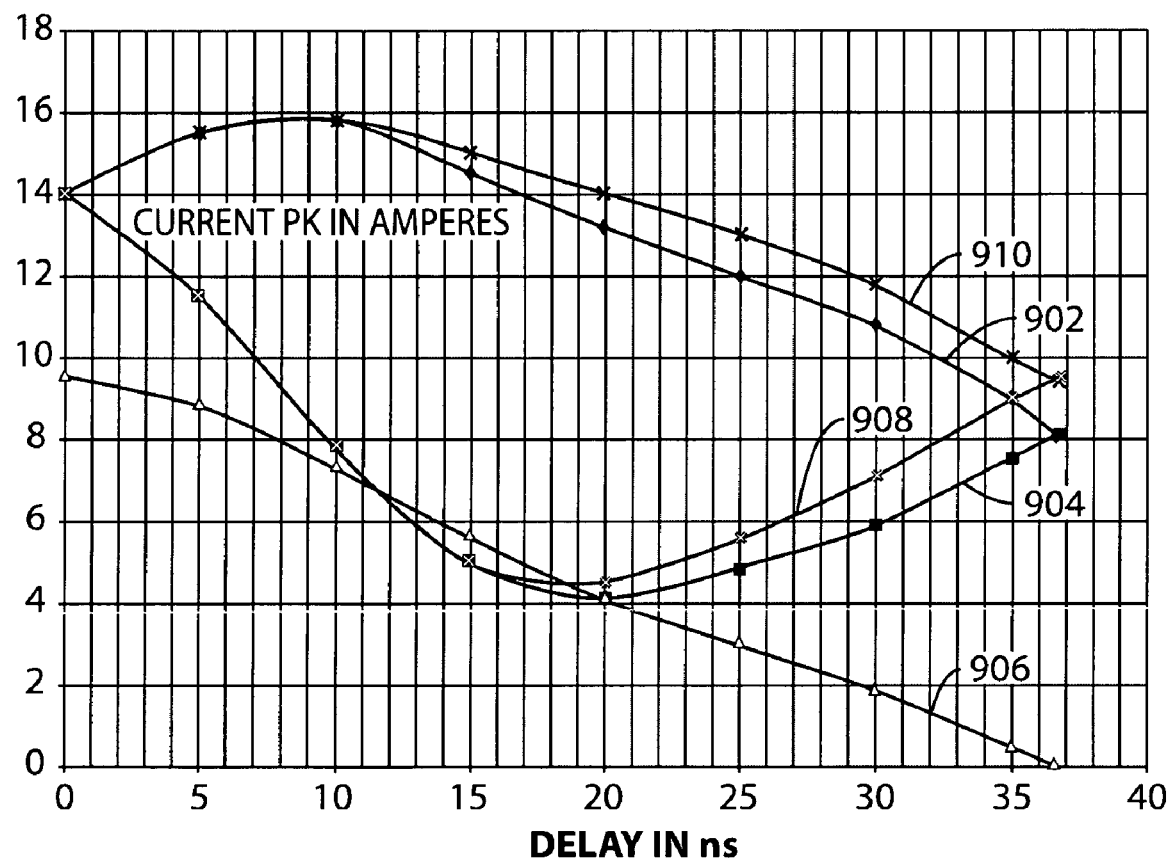
FIG. 9 illustrates currents associated with the MOSFETs and according to one embodiment of the present invention.

FIG. 9 illustrates currents associated with the MOSFETs 810 and 814 according to one embodiment of the present invention. The x-axis indicates the delay time in nanoseconds. The y-axis indicates the peak currents in amperes. A graph 902 shows the peak current of the MOSFET 810 of the half bridge 806. A graph 904 illustrates the peak current of the MOSFET 814 of the half bridge 808. A graph 906 illustrates the current output to the load by the RF generator. A graph 908 illustrates the peak current flowing in the inductor L2. A graph 910 illustrates the peak current flowing in the inductor L1. Adding one or more commutation inductors or circuits raises the current levels of the MOSFETs. That is, the graphs 902 and 904 are shifted upward.

The present invention has been illustrated in terms of specific embodiments to fully disclose and enable the invention. The embodiments disclosed above may be modified or varied without departing from the scope of the present invention. For example, a commutation circuit may be provided proximate the half bridge 808 to assist in commutating this half bridge. The description and drawings provided herein, therefore, should not be used to limit the scope of the present invention.

What is claimed is:

1. A radio frequency (RF) generator, comprising:
   a first half bridge including first and second power transistors;
   a second half bridge including first and second power transistors;
   a resonant circuit provided between the first and second half bridges, the resonant circuit including first, second, and third inductors, wherein the first, second, and third inductors define an RF output node where outputs of the first and second half bridges converge, the output node outputting RF signals to a load;
   positive and negative rails coupled to a power source; and
   a first commutation inductor configured to store energy and facilitate commutation of at least one of the half bridges, wherein the RF generator is operated using a phase shift control.

2. The RF generator of claim 1, wherein the first commutation inductor is provided between the first and second half bridges, so that there is no potential difference across the first commutation inductor when the first and second half bridges are in phase,
   wherein the power source is an AC power source, the positive and negative rails coupling the AC power source via a rectifier.

3. The RF generator of claim 1, further comprising:
   a capacitor provided between the first inductor of the resonant circuit and the output node of the second half bridge,
   wherein the power source is an AC power source, the positive and negative rails coupling the AC power source via a rectifier.

4. The RF generator of claim 1, further comprising:
   a second commutation inductor provided proximate the first half bridge to commutate the first half bridge.

5. The RF generator of claim 1, further comprising:
   a first commutation circuit including a second commutation inductor, the first commutation circuit being provided proximate the first half bridge to facilitate commutation of the first half bridge.

6. The RF generator of claim 5, wherein the first commutation circuit further includes a capacitor in series with the second commutation inductor.

7. The RF generator of claim 6, wherein the capacitor of the first commutation circuit is provided between the output node of the first half bridge and the second commutation inductor.

8. The RF generator of claim 6, further comprising:
   a blocking capacitor provided between the positive rail and the load.

9. The RF generator of claim 5, further comprising:
   a second commutation circuit provide proximate the second half bridge to facilitate commutation of the second half bridge.

10. The RF generator of claim 1, wherein the first commutation inductor is provided proximate the first half bridge to facilitate the commutation of the first half bridge.

11. The RF generator of claim 1, wherein the first and second power transistors are MOSFETs, and the third and fourth power transistors are MOSFETs.

12. The RF generator of claim 1, wherein the RF generator is configured to operate at an Industrial Scientific and Medical (ISM) frequency.

13. The RF generator of claim 12, wherein the RF generator is configured to operate at 13.56 MHz.

14. The RF generator of claim 1, further comprising:
   a matching network provided between the resonant circuit and the load.

15. A radio frequency (RF) generator, comprising:
- a first half bridge including first and second power transistors;
- a second half bridge including first and second power transistors;
- a resonant circuit provided between the first and second half bridges, the resonant circuit including first, second, and third inductors, wherein the first, second, and third inductors define an RF output node where outputs of the first and second half bridges converge, the output node outputting RF signals to a load;
- positive and negative rails coupled to an AC power source via a rectifier; and
- a first commutation inductor configured to store energy and facilitate commutation of at least one of the half bridges,
- wherein the RF signals are output to the load using phase displacements of the transistors.

16. The RF generator of claim 15 wherein the RF signals output to the load is at full power when the first and second half bridges are in phase.

17. The RF generator of claim 15, wherein the first commutation inductor is provided between the first and second half bridges, so that there is no potential difference across the first commutation inductor when the first and second half bridges are in phase.

18. A method for operating an RF generator having first and second half bridges comprising a full bridge configuration, the method comprising:
- causing the first half bridge to output a first signal with a first phase;
- causing the second half bridge to output a second signal with a second phase;
- combining the first and second signals at an RF output node defined by first, second and third inductors to provide an RF signal to a load coupled to the RF generator; and
- storing energy in a commutation inductor to store energy to facilitate commutation of at least one of the first and second half bridges.

* * * * *